(12) United States Patent
Trivedi et al.

(10) Patent No.: US 9,385,722 B2
(45) Date of Patent: Jul. 5, 2016

(54) VOLTAGE LEVEL SHIFTER CIRCUIT

(71) Applicant: Intel Corporation, Santa Clara, CA (US)

(72) Inventors: Amit R. Trivedi, Atlanta, GA (US); Jaydeep P. Kulkarni, Hillsboro, OR (US); Carlos Tokunaga, Hillsboro, OR (US); Muhammad M. Khellah, Tigard, OR (US); James W. Tschanz, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 30 days.

(21) Appl. No.: 14/553,934

(22) Filed: Nov. 25, 2014

(65) Prior Publication Data

US 2016/0149579 A1    May 26, 2016

(51) Int. Cl.
*H03K 19/0175* (2006.01)
*H03K 19/0185* (2006.01)

(52) U.S. Cl.
CPC .............................. *H03K 19/018521* (2013.01)

(58) Field of Classification Search
CPC ............... H03K 19/018521; H03K 3/356113; H03K 19/018528; H03K 17/02
USPC ............... 326/56–58, 63, 68, 80–81; 327/333
See application file for complete search history.

(56) References Cited

U.S. PATENT DOCUMENTS

| | | | |
|---|---|---|---|
| 7,075,335 B2* | 7/2006 | Chin ................... | H03K 17/102 326/26 |
| 7,132,856 B2 | 11/2006 | Hsu et al. | |
| 7,268,588 B2* | 9/2007 | Sanchez ........... | H03K 3/356113 326/68 |
| 8,638,121 B2* | 1/2014 | Suzuki ............... | H03K 3/35613 326/58 |
| 2007/0139092 A1* | 6/2007 | Goncalves ....... | H03K 3/356113 327/333 |
| 2009/0108903 A1* | 4/2009 | Bailey .............. | H03K 3/356182 327/333 |
| 2010/0188119 A1* | 7/2010 | Masleid ............. | H03K 3/35625 326/63 |
| 2010/0264975 A1* | 10/2010 | Scott ............... | H03K 19/018521 327/333 |
| 2012/0187998 A1* | 7/2012 | Jarrar ............. | H03K 19/018521 327/333 |
| 2014/0021999 A1* | 1/2014 | Reed .............. | H03K 19/018507 327/333 |

(Continued)

FOREIGN PATENT DOCUMENTS

| | | |
|---|---|---|
| JP | 2000-228628 A | 8/2000 |
| JP | 2003-198358 A | 7/2003 |

(Continued)

OTHER PUBLICATIONS

International Search Report and Written Opinion mailed Jan. 27, 2016 for International Application No. PCT/US2015/056465, 11 pages.

(Continued)

*Primary Examiner* — Jason M Crawford
(74) *Attorney, Agent, or Firm* — Schwabe, Williamson & Wyatt, P.C.

(57) ABSTRACT

Embodiments include apparatuses, methods, and systems for voltage level shifting a data signal between a low voltage domain and a high voltage domain. In embodiments, a voltage level shifter circuit may include adaptive keeper circuitry, enhanced interruptible supply circuitry, and/or capacitive boosting circuitry to reduce a minimum voltage of the low voltage domain that is supported by the voltage level shifter circuit. Other embodiments may be described and claimed.

24 Claims, 11 Drawing Sheets

(56) References Cited

U.S. PATENT DOCUMENTS

2015/0207508 A1* 7/2015 Wang ............. H03K 19/018507
327/333
2015/0288365 A1* 10/2015 Lai ...................... G11C 16/14
327/333

FOREIGN PATENT DOCUMENTS

| JP | 2003-298409 A | 10/2003 |
| KR | 10-1998-0070751 A1 | 10/1998 |

OTHER PUBLICATIONS

H. Kaul et al, "A 320 mV 56 µW411 GOPS/Watt Ultra-Low Voltage Motion Estimation Accelerator in 65 nm CMOS," IEEE Journal of Solid-State Circuits, Jan. 2009.

S. Hsu et al, "A 280mV-to-1.1V 256b Reconfigurable SIMD Vector Permutation Engine with 2-Dimensional Shuffle in 22nm CMOS," IEEE International Solid-State Circuits Conference (ISSCC), 2012.

* cited by examiner

VOLTAGE LEVEL SHIFTER CIRCUIT

GOVERNMENT INTEREST

This invention was made with Government support under contract number FA8650-13-3-7338 awarded by the Department of Defense. The Government has certain rights in this invention.

FIELD

Embodiments of the present invention relate generally to the technical field of electronic circuits, and more particularly to voltage level shifter circuits.

BACKGROUND

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure. Unless otherwise indicated herein, the approaches described in this section are not prior art to the claims in the present disclosure and are not admitted to be prior art by inclusion in this section.

In integrated circuits, different blocks of the circuit may operate at different supply voltages. Voltage level shifter circuits are used to convert digital input/output (I/O) signals between the blocks (e.g., to convert the I/O signals from a low supply voltage domain to a high supply voltage domain and vice versa).

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings.

DETAILED DESCRIPTION

Figure 1:
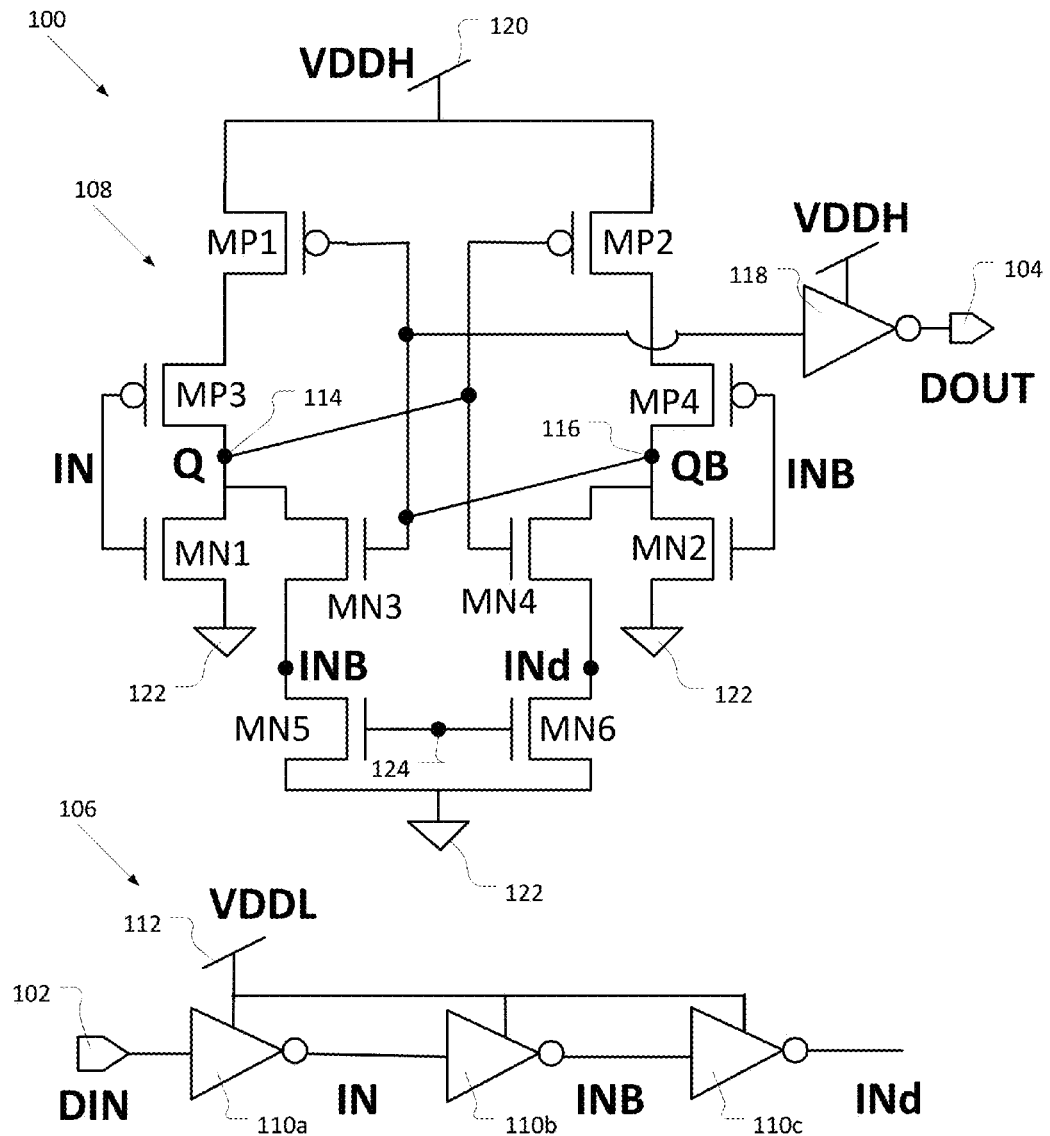
FIG. 1 illustrates a voltage level shifter circuit that includes adaptive keeper circuitry, in accordance with various embodiments.

In the following detailed description, reference is made to the accompanying drawings that form a part hereof wherein like numerals designate like parts throughout, and in which is shown by way of illustration embodiments that may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

Various operations may be described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order than the described embodiment. Various additional operations may be performed and/or described operations may be omitted in additional embodiments.

For the purposes of the present disclosure, the phrases "A and/or B" and "A or B" mean (A), (B), or (A and B). For the purposes of the present disclosure, the phrase "A, B, and/or C" means (A), (B), (C), (A and B), (A and C), (B and C), or (A, B, and C).

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

As used herein, the term "circuitry" may refer to, be part of, or include an Application Specific Integrated Circuit (ASIC), an electronic circuit, a processor (shared, dedicated, or group), a combinational logic circuit, and/or other suitable hardware components that provide the described functionality. As used herein, "computer-implemented method" may refer to any method executed by one or more processors, a computer system having one or more processors, a mobile device such as a smartphone (which may include one or more processors), a tablet, a laptop computer, a set-top box, a gaming console, and so forth.

The description and figures may refer to transistors as MPx transistor to indicate that the transistor is a p-type transistor or MNx transistor to indicate that the transistor is an n-type transistor. The type of transistor is presented as an example, and other embodiments may use other types of transistors to carry out similar functionality.

Various embodiments may include a voltage level shifter circuit to convert a data signal from a first voltage domain to a second voltage domain. The data signal may be a digital data signal that switches between a low voltage level to represent a first logic value (e.g., logic 0) and a high voltage level to represent a second logic value (e.g., logic 1). In some embodiments, the low voltage level may be a ground voltage and the high voltage level may be a positive voltage (e.g., having a value based on a supply voltage used by the voltage domain). A voltage difference between the low voltage level and the high voltage level of the data signal may be greater for the second voltage domain than for the first voltage domain. Additionally, the high supply voltage used by the second voltage domain, VDD high (VDDH), may be greater than the low supply voltage used by the first voltage domain, VDD low (VDDL).

In various embodiments, the voltage level shifter circuit described herein may include one or more components to reduce the minimum voltage, Vmin, of the low supply voltage, VDDL, at which the voltage level shifter circuit may operate (e.g., across process, voltage, and temperature conditions). For example, the voltage level shifter circuit may include adaptive keeper circuitry, enhanced interruptible supply circuitry, and/or capacitive boosting circuitry to reduce the Vmin of the low supply voltage. The reduced Vmin may allow the circuit blocks operating in the first voltage domain to operate with a lower supply voltage, thereby reducing power consumption.

FIG. 1 schematically illustrates a voltage level shifter circuit 100 (hereinafter "circuit 100") that includes adaptive keeper circuitry in accordance with various embodiments. The circuit 100 receives an input data signal DIN at input terminal 102 and passes an output data signal DOUT at an output terminal 104. Circuit 100 includes input circuitry 106 coupled to level-shifter circuitry 108. Input circuitry 106 may include three inverters 110a-c coupled in series with the input terminal 102 to generate an input signal IN (an inverted version of the input data signal DIN), an input bar signal INB (an inverted version of the input signal IN), and a delayed input signal INd (a delayed version of the input signal IN) as shown. The input signal IN, input bar signal INB, and the delayed input signal INd may be passed to level-shifter circuitry 108 at respective nodes with corresponding labels as shown in FIG. 1. The input circuitry 106 and level-shifter circuitry 108 are shown as separate circuitry for ease of illustration.

In various embodiments, the input data signal DIN may be received by the input terminal 102 in the low voltage domain. The inverters 110a-c may be coupled to a low voltage supply rail 112 to receive a low supply voltage VDDL, and the inverters 110a-c may operate on the low supply voltage VDDL.

In various embodiments, level-shifter circuitry 108 may include a data node (Q) 114 that is driven to a current value of the input signal IN and a data bar node (QB) 116 that is driven to the inverse of the current value of the input signal IN. The data bar node 116 is coupled to the output terminal 104 via an inverter 118 to provide the output data signal DOUT. In other embodiments, the output terminal 104 may be coupled to the data node 114 to receive the output data signal DOUT.

In various embodiments, the level-shifter circuitry 108 may include a high supply voltage rail 120 to receive a high supply voltage VDDH. Pull-up transistors MP1 and MP2 may be coupled to the high supply voltage rail 120 (e.g., at their source terminals). An interruption transistor MP3 may be coupled between the pull-up transistor MP1 and the data node 114. An interruption transistor MP4 may be coupled between the pull-up transistor MP2 and the data bar node 116. A pull-down transistor MN1 may be coupled between the data node 114 and a ground voltage 122, and a pull-down transistor MN2 may be coupled between the data bar node 116 and the ground voltage 122. The interruption transistor MP3 and the pull-down transistor MN1 may receive the input signal IN at their respective gate terminals. The interruption transistor MP4 and the pull-down transistor MN2 may receive the input bar signal INB at their respective gate terminals.

In various embodiments, the adaptive keeper circuitry of circuit 100 may include keeper transistors MN3 and MN4 and/or firewall transistors MN5 and MN6. In embodiments, the drain terminal of the keeper transistor MN3 may be coupled to receive the input bar signal INB. The source terminal of the keeper transistor MN3 may be coupled to the data node 114, and the gate terminal of the keeper transistor MN3 may be coupled to the data bar node 116. In embodiments, the drain terminal of the keeper transistor MN4 may be coupled to receive the delayed input signal INd. The source terminal of the keeper transistor MN4 may be coupled to the data bar node 116, and the gate terminal of the keeper transistor MN4 may be coupled to the data node 114.

Firewall transistor MN5 may be coupled between the keeper transistor MN3 and the ground voltage 122, and firewall transistor MN6 may be coupled between the keeper transistor MN4 and the ground voltage 122. The gate terminals of the firewall transistors MN5 and MN6 may be coupled to one another at a firewall node 124. The firewall node 124 may receive a firewall signal that has a value of logic low (e.g., 0 Volts) when the low voltage domain is active (e.g., not power-gated) and may have a value of logic high when the low voltage domain is power-gated (e.g., powered off). When the low voltage domain is power-gated, the low supply voltage VDDL may be lowered and/or shut off (e.g., brought to 0 Volts). In various embodiments, the firewall transistors MN5 and MN6 may be off (e.g., not conducting) when the firewall signal has a value of logic low.

In various embodiments, when the input signal IN switches from a logic high level (e.g., VDDL) to a logic low level (e.g., 0 Volts), the pull-down transistor MN1 may turn off and keeper transistor MN3 may turn on, thereby charging the data node 114. At this point, the data node 114 may have a high resistance, and the voltage at the gate terminal of the keeper transistor MN3 (and the data bar node 116) may have a value of VDDH. In various embodiments, the high supply voltage VDDH may be greater than the sum of the low supply voltage VDDL and the threshold voltage VTHmn3 of the keeper transistor MN3. Accordingly, the data node 114 may be charged to VDDL through the keeper transistor MN3. Alternatively, VDDH may be less than the sum of VDDL and VTHmn3, in which case the data node 114 may be charged to a value of VDDH−VTHmn3.

Accordingly, the gate-to-source voltage of the pull-up transistor MP2 may be reduced, thereby reducing the pull-up strength of the pull-up transistor MP2 (e.g., the amount of current conducted by MP2). Therefore, the contention between the pull-down transistor MN2 and the pull-up transistor MP2 is mitigated at low VDDL, allowing the pull-down transistor MN2 to pull the data bar node 116 to 0 Volts. When the transition of the data bar node 116 from VDDH to 0 Volts is completed, the keeper transistor MN3 may turn off, and the data node 114 may be charged to VDDH through the pull-up transistor MP1.

Similar contention reduction is provided by the keeper transistor MN4 when the input bar signal INB switches from logic high to logic low. The keeper transistor MN4 may assist the switching process by reducing contention between pull-up transistor MP1 and pull-down transistor MN1, similar to the contention reduction provided by keeper transistor MN3 for pull-up transistor MP2 and pull-down transistor MN2. Since the drain terminal of the keeper transistor MN4 receives the delayed input signal INd, the pull-down transistor MN2 may turn off (e.g., based on the input bar signal INB) before the keeper transistor MN4 begins charging the data bar node 116.

In various embodiments, an additional contention path may exist when the data bar node 116 is pulled down and the pull-up transistor MP1 turns on. While the keeper transistor MN3 provides VDDL to the data node 114, the pull-up transistor MP1 charges the data node 114 to VDDH. This contention path ceases to exist when the data node 114 completely toggles to 0 and the keeper transistor MN3 turns off. However, this contention path may add delay to the circuit 100 (e.g., delay from the input data signal DIN to the output data signal DOUT).

Additionally, a short circuit current may flow to the low voltage supply rail 112 from the high voltage supply rail 120 via the pull-up transistor MP1 and the keeper transistor MN3 during the contention between the pull-up transistor MP1 and the keeper transistor MN3. However, in some embodiments, this short circuit current may be utilized by one or more devices (e.g., logic devices) operating in the low voltage domain. Accordingly, the short circuit current may not be wasted.

In various embodiments, the firewall transistors MN5 and MN6 and/or the transistors of the inverter 110c may be of relatively small size. The firewall transistors MN5 and MN6 may only be on when the low voltage domain is power-gated, and may not affect the delay of the circuit 100.

Figure 2:
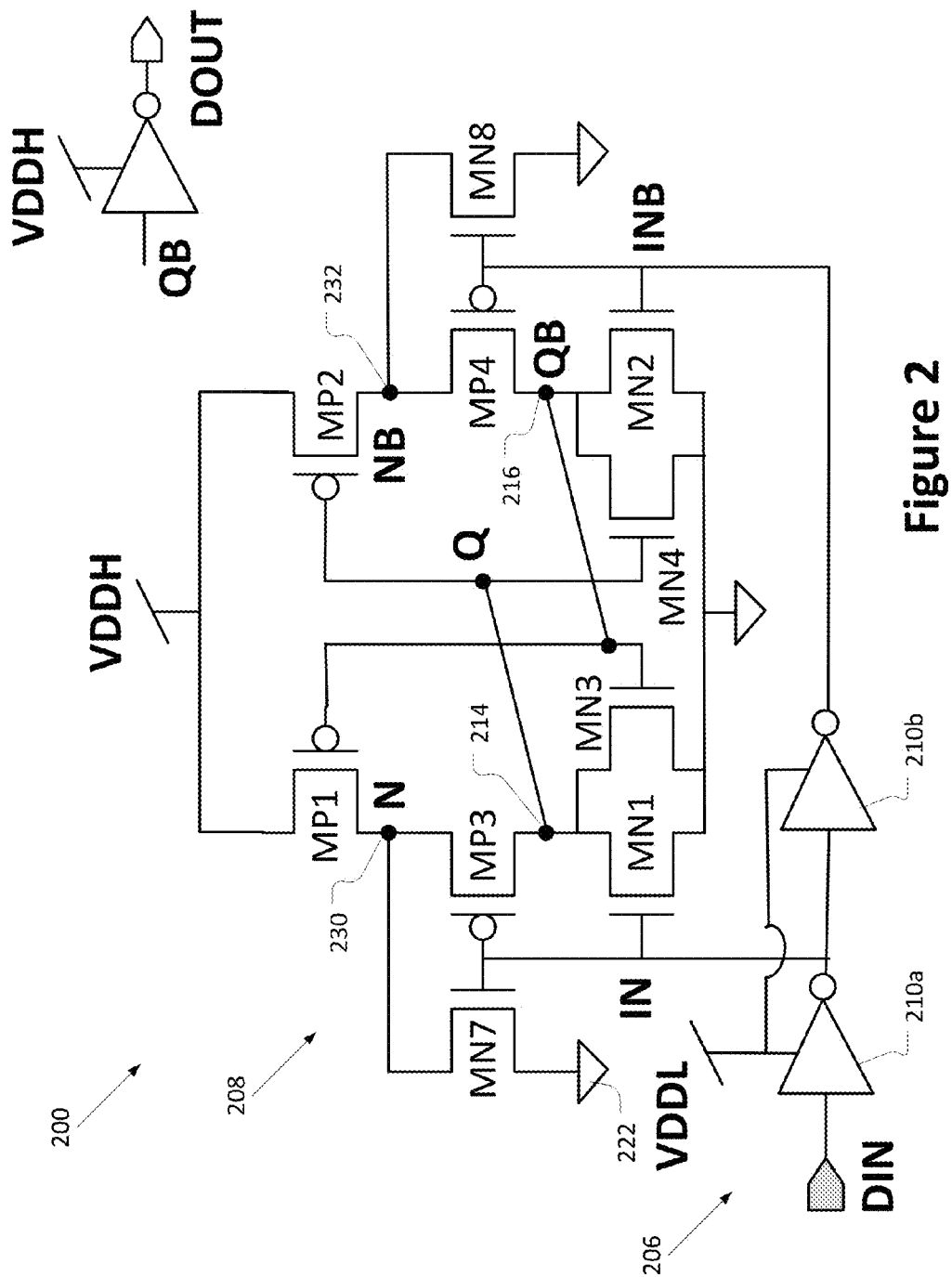
FIG. 2 illustrates a voltage level shifter circuit that includes enhanced interruptible supply circuitry, in accordance with various embodiments.

FIG. 2 illustrates a voltage level shifter circuit 200 (hereinafter "circuit 200") that includes enhanced interruptible supply circuitry in accordance with various embodiments. Circuit 200 may include similar components to components of circuit 100, as denoted by like reference elements. Circuit 200 may not include the adaptive keeper circuitry of circuit 100. Accordingly, the drain terminals of the keeper transistors MN3 and MN4 may be coupled to the ground voltage 222, and the circuit 200 may not include firewall transistors. Additionally, the input circuitry 206 may include two inverters 210a-b to generate an input signal IN (the inverse of the input data signal DIN) and an input bar signal INB (the inverse of the input data signal DIN).

In various embodiments, the level-shifter circuitry 208 of circuit 200 may include enhanced interruptible supply circuitry that includes pull-down transistors MN7 and MN8. The source terminal of the pull-down transistor MN7 may be coupled to an intermediate node (N) 230 between the pull-up transistor MP1 and the interruption transistor MP3. The gate terminal of the pull-down transistor MN7 may receive the input signal IN (e.g., may be coupled to the gate terminal of the interruption transistor MP3 and/or the gate terminal of the pull-down transistor MN1).

The source terminal of the pull-down transistor MN8 may be coupled to an intermediate bar node (NB) 232 between the pull-up transistor MP2 and the interruption transistor MP4. The gate terminal of the pull-down transistor MN8 may receive the input bar signal INB (e.g., may be coupled to the gate terminal of the interruption transistor MP4 and/or the gate terminal of the pull-down transistor MN2). The drain terminals of the pull-down transistors MN7 and MN8 may be coupled to a common ground voltage 222.

In various embodiments, when the input signal IN makes a transition from 0 to VDDL, the gate-to-source voltage of the interruption transistor MP3 reduces, thereby reducing the strength of the pull-up path provided by pull-up transistor MP1 and interruption transistor MP3. Accordingly, the data node 214 may be pulled down to 0 Volts through the pull-down transistor MN1. However, as the value of VDDL is reduced, the supply interruption provided by the interruption transistor MP3 is reduced, and a contention path may exist between the pull-up transistor MP1 and the pull-down transistor MN1.

In various embodiments, the pull-down transistor MN7 may provide additional supply interruption to further weaken the pull-down path and allow a reduced value of VDDL to be used (e.g., reduced Vmin). When the input signal IN makes a transition from 0 to VDDL, a resistive path is formed between the pull-down transistor MN7 and the pull-up transistor MP1. The resistive path reduces the voltage of the intermediate node N by an amount Δ (e.g., from VDDH to VDDH−Δ). The reduction of the voltage of the intermediate node N may reduce the gate-to-source voltage of the interruption transistor MP3, thereby enhancing the supply interruption provided by the interruption transistor MP3.

For example, when VDDL is relatively low (e.g., close to Vmin), and the interruption transistor MP3 is in a sub-threshold regime during a level transition, even a small reduction in the voltage at the intermediate node N may significantly reduce the strength of the interruption transistor MP3. In one non-limiting example, a Δ of about 100 mV may provide about a 10-times reduction in pull-up strength of the pull-up path provided by the pull-up transistor MP1 and the interruption transistor MP3.

Similar supply interruption may be provided by the interruption transistor MP4 and pull-down transistor MN8 to reduce the strength of the pull-up path provided by the pull-up transistor MP2 and the interruption transistor MP4 for the data bar node 216 when the input bar signal INB transitions from 0 to VDDL.

Figure 3:
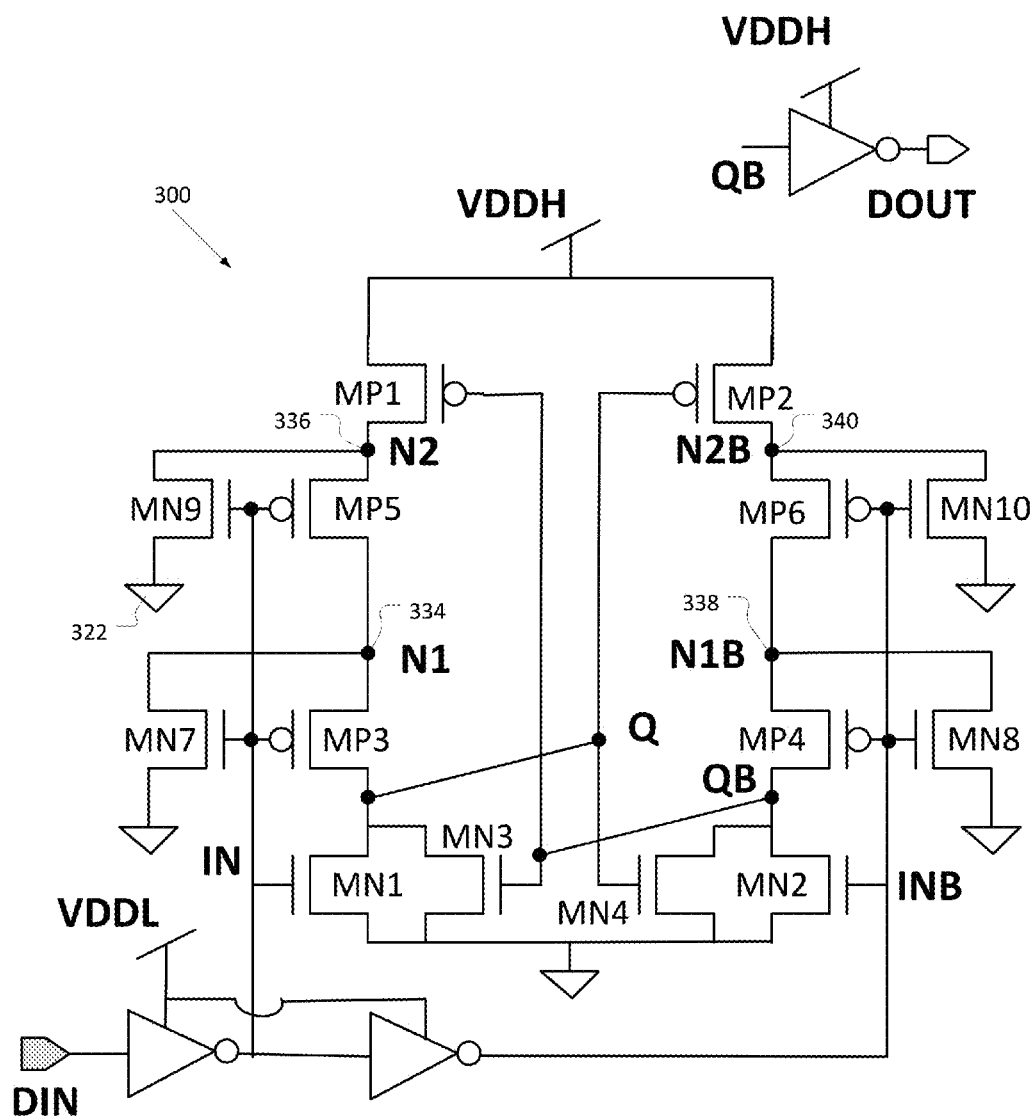
FIG. 3 illustrates a voltage level shifter circuit that includes stacked enhanced interruptible supply circuitry, in accordance with various embodiments.

FIG. 3 illustrates a voltage level shifter circuit 300 (hereinafter "circuit 300") that includes stacked enhanced interruptible supply circuitry in accordance with various embodiments. Circuit 300 may include similar components to components of circuit 200, as denoted by like reference elements.

Compared with circuit 200, circuit 300 may include additional interruption transistors MP5 and MP6, and additional pull-down transistors MN9 and MN10. Interruption transistor MP5 may be coupled between the pull-up transistor MP1 and the interruption transistor MP3 (e.g., a drain terminal of the interruption transistor MP5 may be coupled to the source terminal of the interruption transistor MP3 at a first intermediate node (N1) 334, and a source terminal of the interruption transistor MP5 may be coupled to a drain terminal of the pull-up transistor MP1 at a second intermediate node (N2) 336). The gate terminal of the pull-down transistor MN9 and the gate terminal of the interruption transistor MP5 may receive the input signal IN. The source terminal of the pull-down transistor MN9 may be coupled to the second intermediate node 336 and the drain terminal of the pull-down transistor MN9 may be coupled to the ground voltage 322.

The interruption transistor MP6 and pull-down transistor MN10 may be coupled within circuit 300 in a similar manner, as shown in FIG. 3. For example, the interruption transistor MP6 may be coupled between a first intermediate bar node (NIB) 338 and a second intermediate bar node (N2B) 340 (e.g., between the interruption transistor MP4 and the pull-up transistor MP2). The pull-down transistor MN10 may be coupled between the second intermediate node 340 and the ground voltage 322.

In various embodiments, the interruption transistor MP5 and pull-down transistor MN9 may provide further supply interruption to further weaken the pull-down strength of the pull-down path provided by pull-up transistor MP1 and the interruption transistors MP3 and MP5. Similarly, the interruption transistor MP6 and pull-down transistor MN10 may provide further supply interruption to further weaken the pull-down strength of the pull-down path provided by pull-up transistor MP2 and interruption transistors MP4 and MP6.

Figure 4:
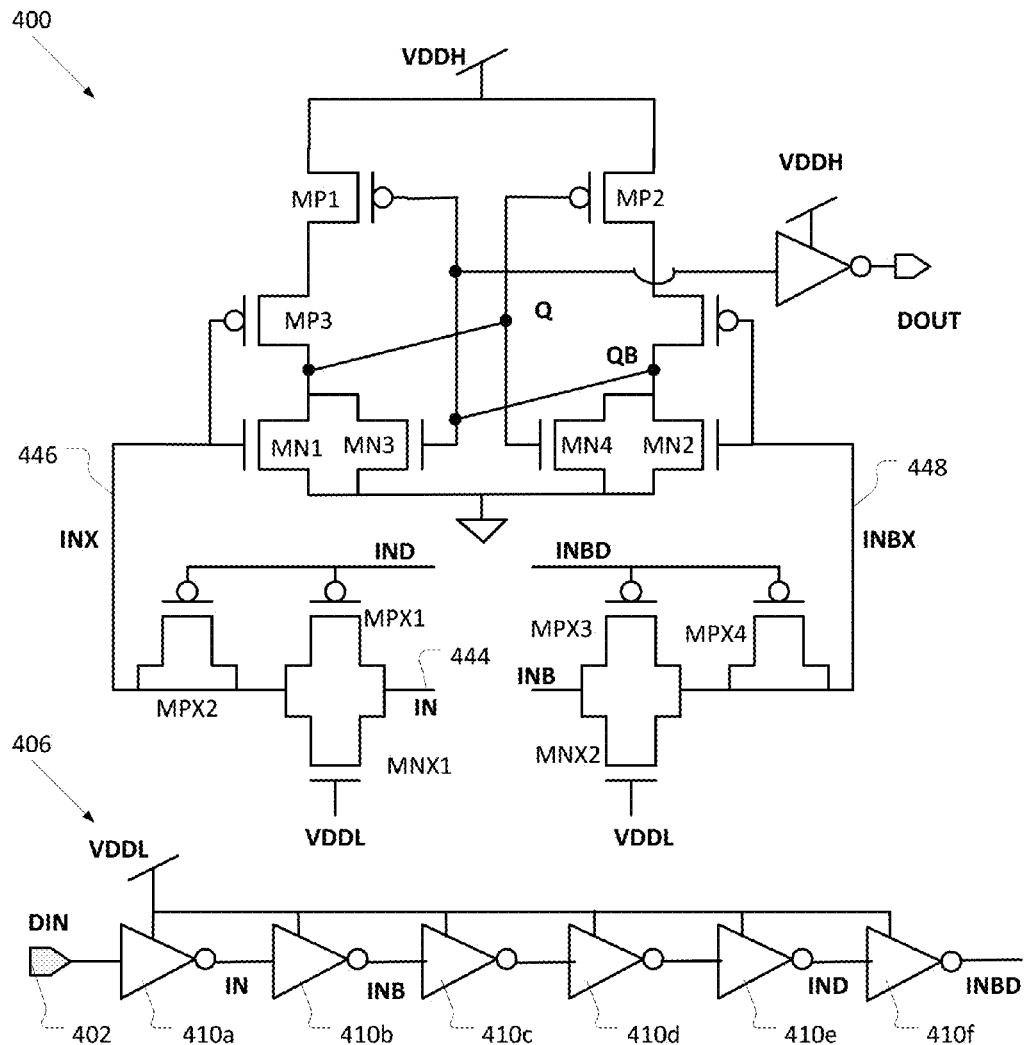
FIG. 4 illustrates a voltage level shifter circuit that includes capacitive boosting circuitry, in accordance with various embodiments.

FIG. 4 illustrates a voltage level shifter circuit 400 (hereinafter "circuit 400") that includes capacitive boosting circuitry in accordance with various embodiments. Circuit 400 may include similar components to components of circuit 100 and/or 200, as denoted by like reference elements. Circuit 400 may not include the adaptive keeper circuitry of circuit 100 or the enhanced interruptible supply circuitry of circuit 200 or circuit 300.

In various embodiments, the input circuitry 406 may include a plurality of inverters 410a-f coupled in series with input terminal 402. The inverters 410a-f may generate the input signal IN, the input bar signal INB, a delayed input signal IND, and a delayed input bar signal INBD. In some embodiments, the delayed input signal IND and the delayed input bar signal INBD may be delayed by a longer time period than the delayed input signal INd discussed above with respect to the circuit 100 of FIG. 1.

In various embodiments, the capacitive boosting circuitry of circuit 400 may include p-type transistors MPX1, MPX2, and n-type transistor MNX1 coupled between an input node 444 that receives the input signal IN and a boosted input node 446 that receives a boosted input signal INX. The transistors MNX1 and MPX1 may receive the input signal at their drain terminals. Transistor MPX2 may be capacitively configured (e.g., with its drain and source terminals coupled to one another along the conductive path between the input node 444 and the boosted input node 446). Transistor MNX1 may receive the low supply voltage VDDL at its gate terminal, and the gate terminals of transistors MPX1 and MPX2 may receive the delayed input signal IND.

In various embodiments, the boosted input signal INX may be passed to the input of the level-shifting circuitry 408 (e.g., to the interruption transistor MP3 and the pull-down transistor MN1). In various embodiments, when the input signal IN has a value of VDDL, the capacitive boosting circuitry may generate the boosted input signal INX with a higher voltage than VDDL.

When the input signal IN transitions from 0 to VDDL, the delayed input signal IND has not yet transitioned, and thus transistors MPX1 and MPX2 are on. The boosted input node 446 may be charged to VDDL through transistor MPX1 as long as the delayed input signal IND remains at 0 Volts. Subsequently, when the delayed input signal IND transitions from 0 to VDDL, the rising voltage of the delayed input signal IND is passed to the boosted input node 446 through the capacitively coupled transistor MPX2, thereby charging the boosted input signal INX to a voltage greater than VDDL.

In embodiments, the transistor MNX1 may act as a diode (e.g., when the input signal IN is VDDL). If the voltage of the boosted input signal INX drops below VDDL–VTHmnx1 (where VTHmnx1 is the threshold voltage of the transistor MNX1), transistor MNX1 may turn on to charge the boosted input node 446.

In various embodiments, the higher voltage of the boosted input signal INX compared with the input signal IN may increase the pull-down strength of the pull-down transistor MN1, thereby reducing contention between the pull-down transistor MN1 and the pull-up transistor MP1.

In various embodiments, similar capacitive boosting may be provided by transistors MPX3, MPX4, and MNX2 when the input bar signal INB transitions from 0 to VDDL. The capacitively coupled transistor MPX4 may generate a boosted input bar signal INBX at boosted input node 448.

In some embodiments, a voltage level shifter circuit may include any combination of adaptive keeper circuitry (e.g., the adaptive keeper circuitry of circuit 100), enhanced interruptible supply circuitry (e.g., the enhanced interruptible supply circuitry of circuit 200 or circuit 300), and/or capacitive boosting circuitry (e.g., the capacitive boosting circuitry of circuit 400). The adaptive keeper circuitry, enhanced interruptible supply circuitry, and capacitive boosting circuitry may each provide a reduced minimum voltage Vmin (e.g., the minimum voltage of the low supply voltage VDDL) for the voltage level shifter circuit. However, the adaptive keeper circuitry, enhanced interruptible supply circuitry, and capacitive boosting circuitry may each also contribute delay to the voltage level shifter circuit. Accordingly, the combination and/or configuration of the adaptive keeper circuitry, enhanced interruptible supply circuitry, and/or capacitive boosting circuitry may be chosen based on the application.

Figure 5:
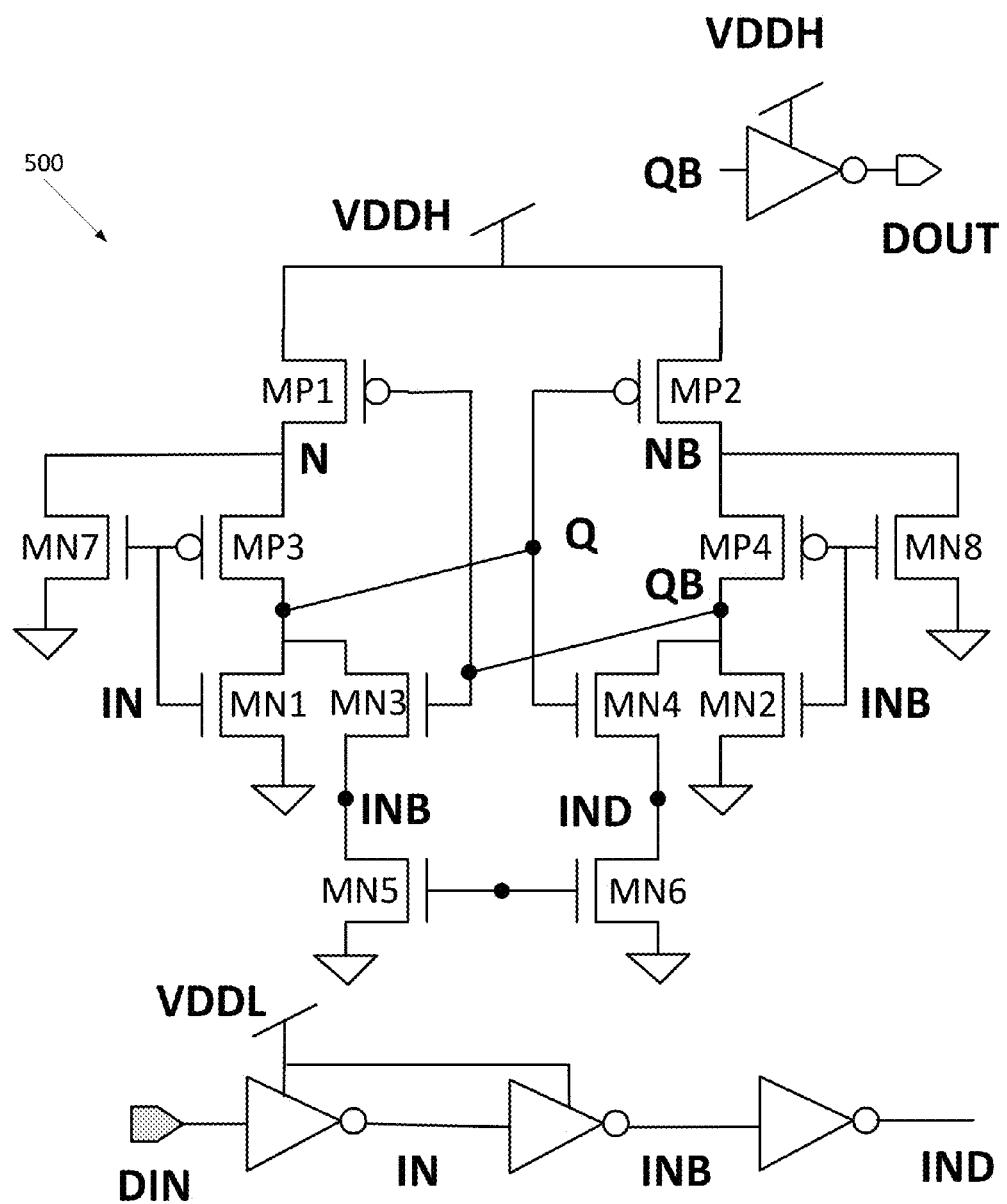
FIG. 5 illustrates a voltage level shifter circuit that includes adaptive keeper circuitry and enhanced interruptible supply circuitry, in accordance with various embodiments.

For example, FIG. 5 illustrates a voltage-level shifter circuit 500 (hereinafter "circuit 500") that includes adaptive keeper circuitry and enhanced interruptible supply circuitry in accordance with various embodiments. The adaptive keeper circuitry may include keeper transistors MN3 and MN4 and firewall transistors MN5 and MN6 similar to the adaptive keeper circuitry of circuit 100. The enhanced interruptible supply circuitry may include the pull-down transistors MN7 and MN8 and the interruption transistors MP3 and MP4 similar to the enhanced interruptible supply circuitry of circuit 200.

Figure 6:
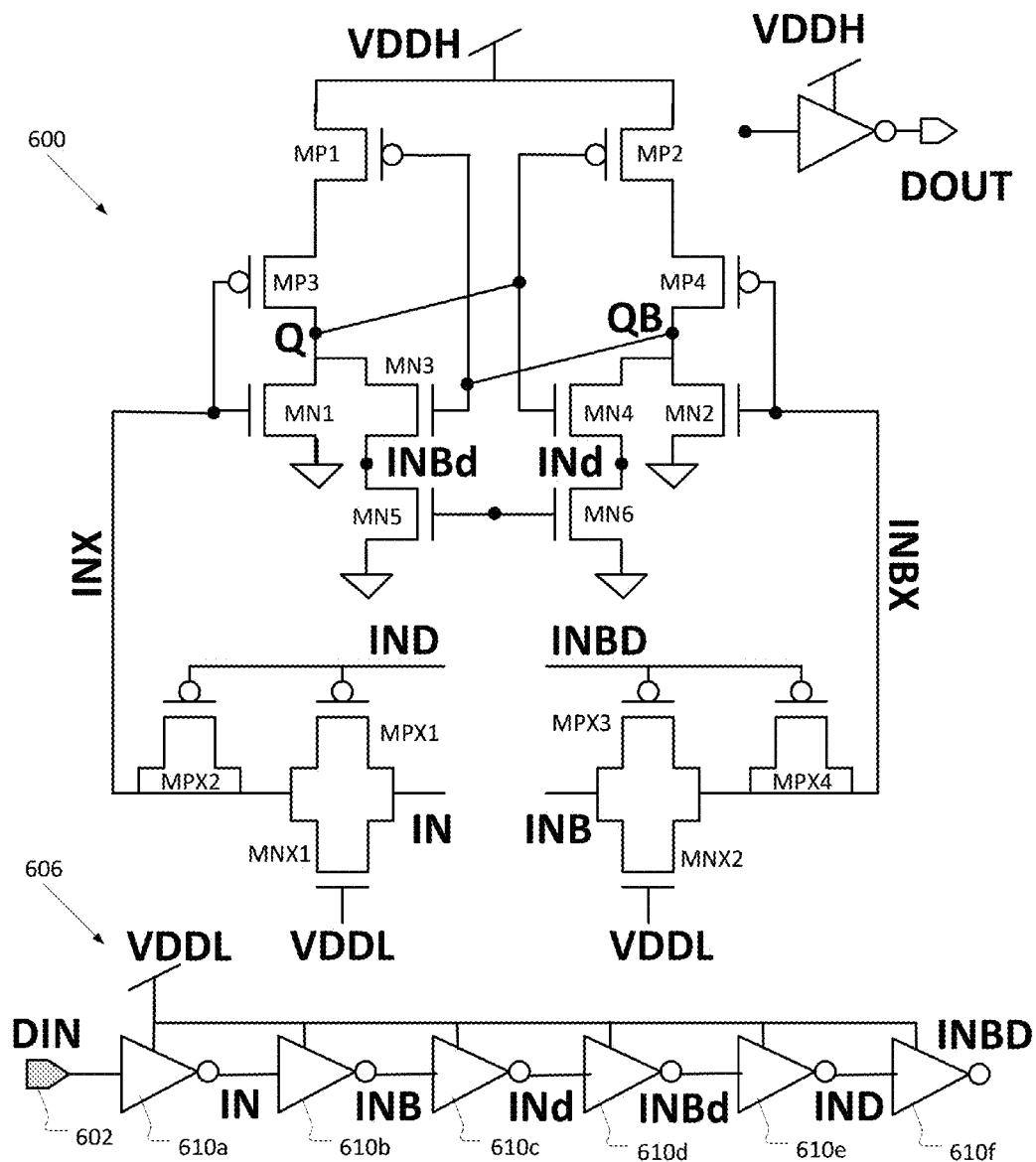
FIG. 6 illustrates a voltage level shifter circuit that includes adaptive keeper circuitry and capacitive boosting circuitry, in accordance with various embodiments.

FIG. 6 illustrates a voltage-level shifter circuit 600 (hereinafter "circuit 600") that includes adaptive keeper circuitry and capacitive boosting circuitry. The adaptive keeper circuitry may include keeper transistors MN3 and MN4 and firewall transistors MN5 and MN6 similar to the adaptive keeper circuitry of circuit 100. The capacitive boosting circuitry may include p-type transistors MPX1 and MPX3, n-type transistors MNX1 and MNX2, and capacitively coupled transistors MPX2 and MPX4 similar to the capacitive boosting circuitry of circuit 400.

In embodiments, the circuit 600 may further include input circuitry 606 including a plurality of inverters 610a-f. The input circuitry 606 may receive the input data signal DIN from input terminal 602, and may generate an input signal IN, an input bar signal INB, a first delayed input signal INd, a first delayed input bar signal INBd, a second delayed input signal IND, and a second delayed input bar signal INBD. The second delayed input signal IND and second delayed input bar signal INBD may be delayed by a longer time period than the first delayed input signal INd and the first delayed input bar signal INBd, respectively.

The first delayed input bar signal INBd may be passed to the drain terminal of the keeper transistor MN3, and the first delayed input signal INd may be passed to the drain terminal of the keeper transistor MN4. The second delayed input signal IND may be passed to the gate terminals of the p-type transistor MPX1 and the capacitively coupled transistor MPX2. The second delayed input bar signal INBD may be passed to the gate terminals of the p-type transistor MPX3 and the capacitively coupled transistor MPX4. In some embodiments, the input circuitry 606 may include additional inverters coupled between inverter 610a and inverter 610f to provide a desired delay for the signals INd, INBd, IND, and/or INBD.

Figure 7:
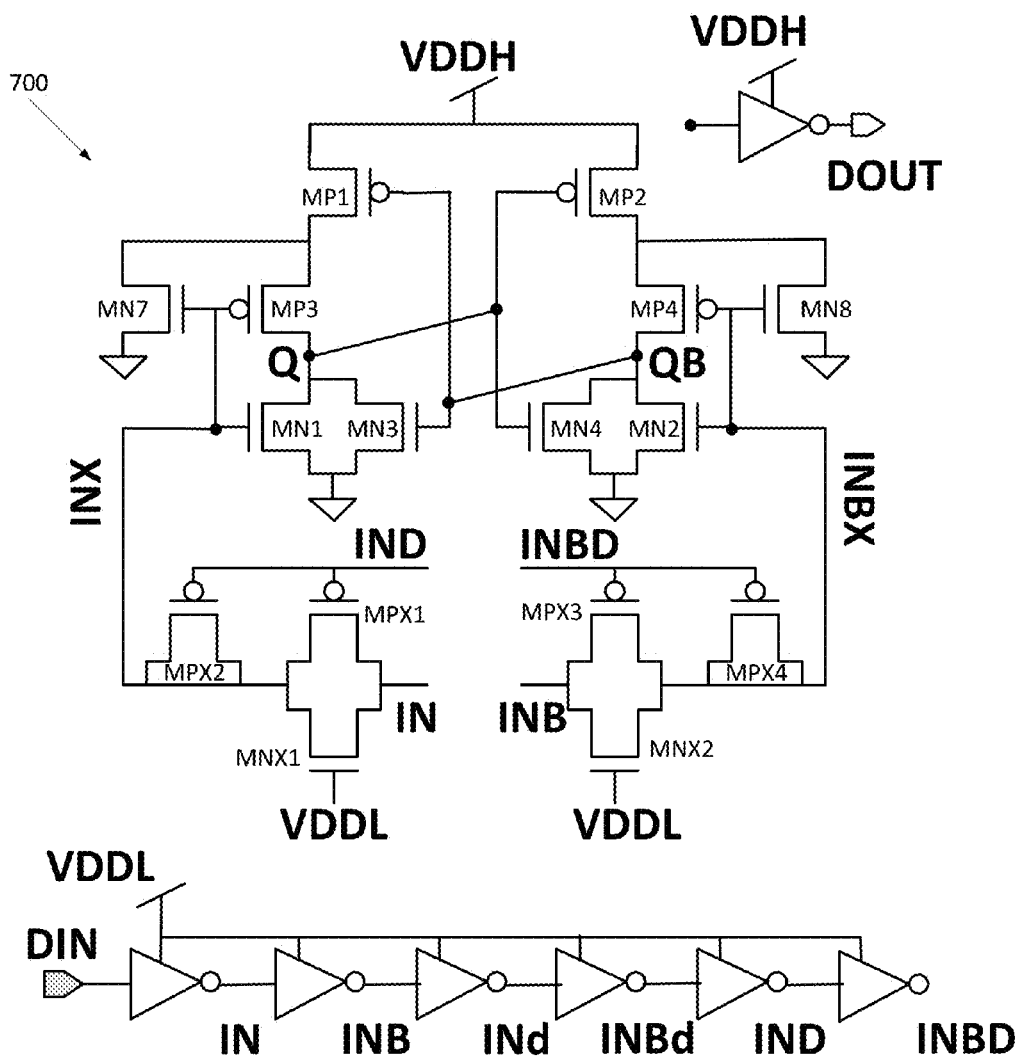
FIG. 7 illustrates a voltage level shifter circuit that includes enhanced interruptible supply circuitry and capacitive boosting circuitry, in accordance with various embodiments.

FIG. 7 illustrates a voltage level shifter circuit 700 (hereinafter "circuit 700") that includes enhanced interruptible supply circuitry and capacitive boosting circuitry. The enhanced interruptible supply circuitry may include the pull-down transistors MN7 and MN8 and the interruption transistors MP3 and MP4 similar to the enhanced interruptible supply circuitry of circuit 200. The capacitive boosting circuitry may include p-type transistors MPX1 and MPX3, n-type transistors MNX1 and MNX2, and capacitively coupled transistors MPX2 and MPX4 similar to the capacitive boosting circuitry of circuit 400.

Figure 8:
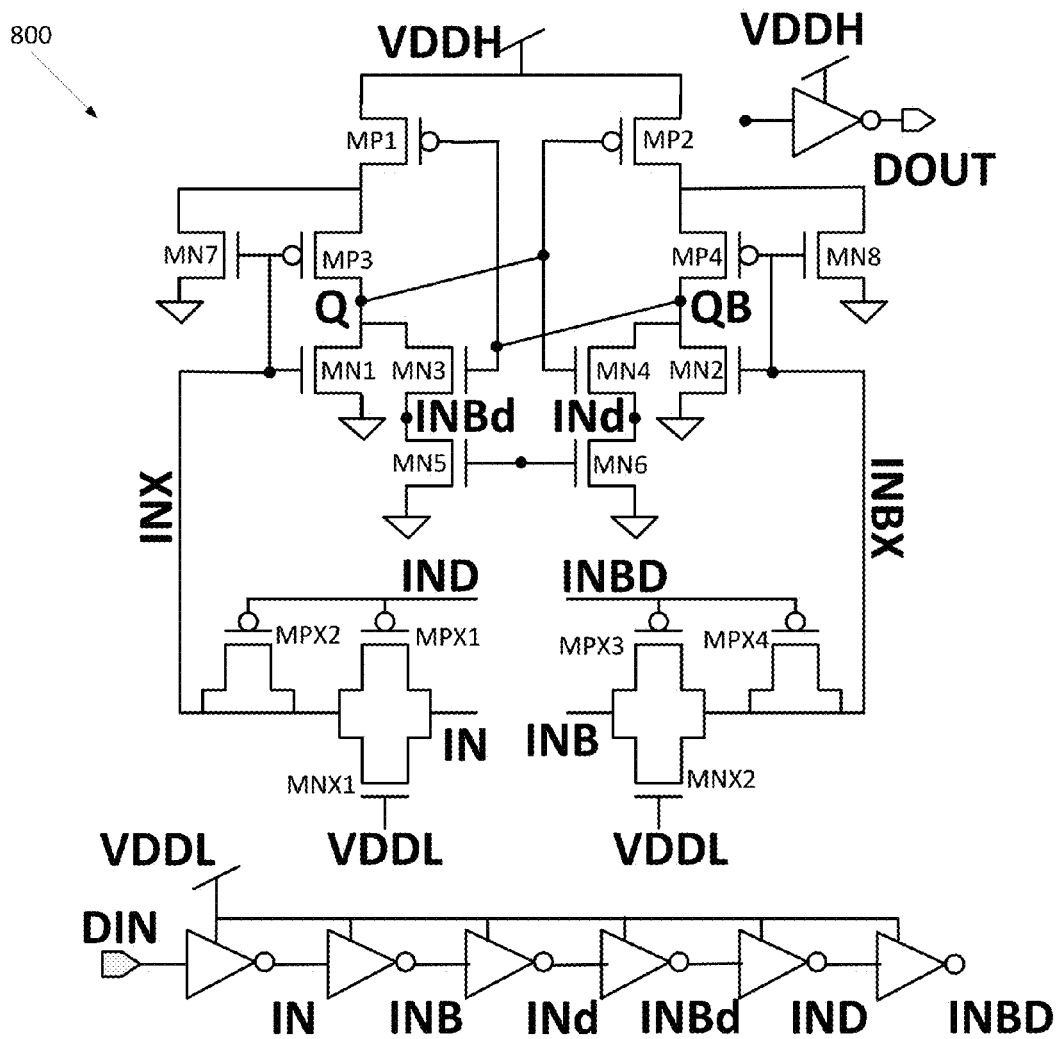
FIG. 8 illustrates a voltage level shifter circuit that includes adaptive keeper circuitry, enhanced interruptible supply circuitry, and capacitive boosting circuitry, in accordance with various embodiments.

FIG. 8 illustrates a voltage level shifter circuit 800 (hereinafter "circuit 800") that includes adaptive keeper circuitry, enhanced interruptible supply circuitry, and capacitive boosting circuitry in accordance with various embodiments. The adaptive keeper circuitry may include keeper transistors MN3 and MN4 and firewall transistors MN5 and MN6 similar to the adaptive keeper circuitry of circuit 100. The enhanced interruptible supply circuitry may include the pull-down transistors MN7 and MN8 and the interruption transistors MP3 and MP4 similar to the enhanced interruptible supply circuitry of circuit 200. The capacitive boosting circuitry may include p-type transistors MPX1 and MPX3, n-type transistors MNX1 and MNX2, and capacitively coupled transistors MPX2 and MPX4 similar to the capacitive boosting circuitry of circuit 400.

Figure 9:
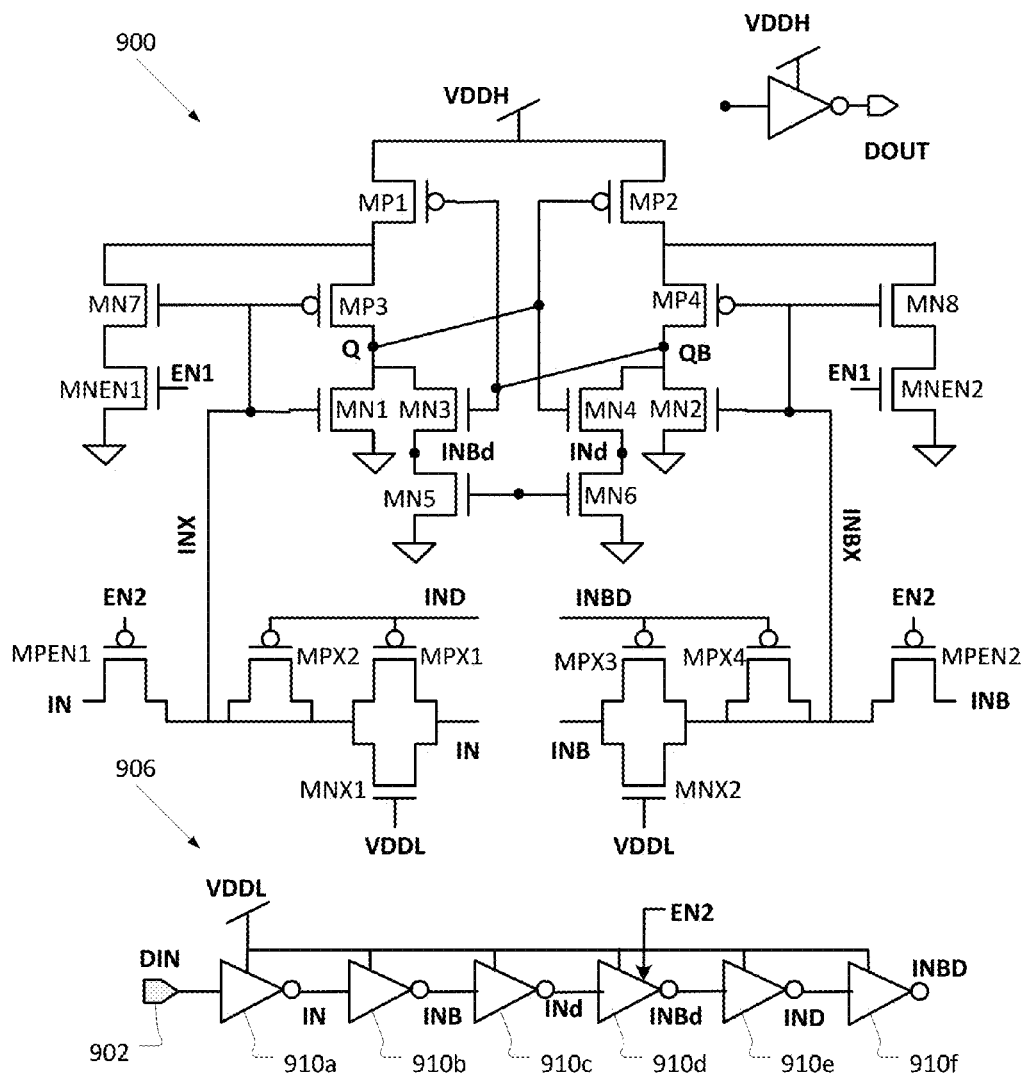
FIG. 9 illustrates a voltage level shifter circuit that includes adaptive keeper circuitry, selectively enabled enhanced interruptible supply circuitry, and selectively enabled capacitive boosting circuitry, in accordance with various embodiments.

FIG. 9 illustrates a voltage level shifter circuit 900 (hereinafter "circuit 900") that includes adaptive keeper circuitry, enhanced interruptible supply circuitry, and capacitive boosting circuitry similar to circuit 800. Circuit 900 may further include enable transistors MNEN1 and MNEN2 to allow the enhanced interruptible supply circuitry to be selectively enabled. Enable transistor MNEN1 may be coupled between the pull-down transistor MN7 and ground. The enable transistor MNEN2 may be coupled between the pull-down transistor MN8 and ground. The enable transistors MNEN1 and MNEN2 may receive a first enable signal EN1 at their respective gate terminals. The first enable signal may turn on the enable transistors MNEN1 and MNEN2 to enable the enhanced interruptible supply circuitry, and may turn off the enable transistors MNEN1 and MNEN2 to disable the enhanced interruptible supply circuitry.

Additionally, or alternatively, the circuit 900 may include enable transistors MPEN1 and MPEN2 to allow the capacitive boosting circuitry to be selectively enabled. A source terminal of enable transistor MPEN1 may be coupled to the boosted input node 946. A drain terminal of the enable transistor MPEN1 may be coupled to the inverter 910a of input circuitry 906 to receive the input signal IN. The gate terminal of the enable transistor MPEN1 may receive a second enable signal EN2. A source terminal of enable transistor MPEN2 may be coupled to the boosted input bar node 948. A drain terminal of the enable transistor MPEN2 may be coupled to the inverter 910b of input circuitry 906 to receive the input bar signal INB. The gate terminal of the enable transistor MPEN2 may receive a second enable signal EN2.

The second enable signal EN2 may turn off the enable transistors MPEN1 and MPEN2 to enable the capacitive boosting circuitry. The second enable signal EN2 may turn on the enable transistors MPEN1 and MPEN2 to disable the capacitive boosting circuitry. When the capacitive boosting circuitry is disabled, the enable transistor MPEN1 may pass the input signal IN to the boosted input node 946, and the enable transistor MPEN2 may pass the input bar signal INB to the boosted input bar node 948.

In various embodiments, input circuitry 906 of circuit 900 may include a plurality of inverters 910a-f coupled in series with the input terminal 902. In some embodiments, the inverter 910d of input circuitry 906 may be a tri-state inverter and may receive the second enable signal EN2 at a tri-state input to selectively place the inverter 910d in tri-state mode when the capacitive boosting circuitry is disabled. When the inverter 910d is in tri-state mode, the output of inverter 910d may have a high impedance and may effectively shut off the outputs of inverters 910e and 910f. Accordingly, the transistors MPX1, MPX2, MPX3, and MPX4 may be turned off.

Figure 10:
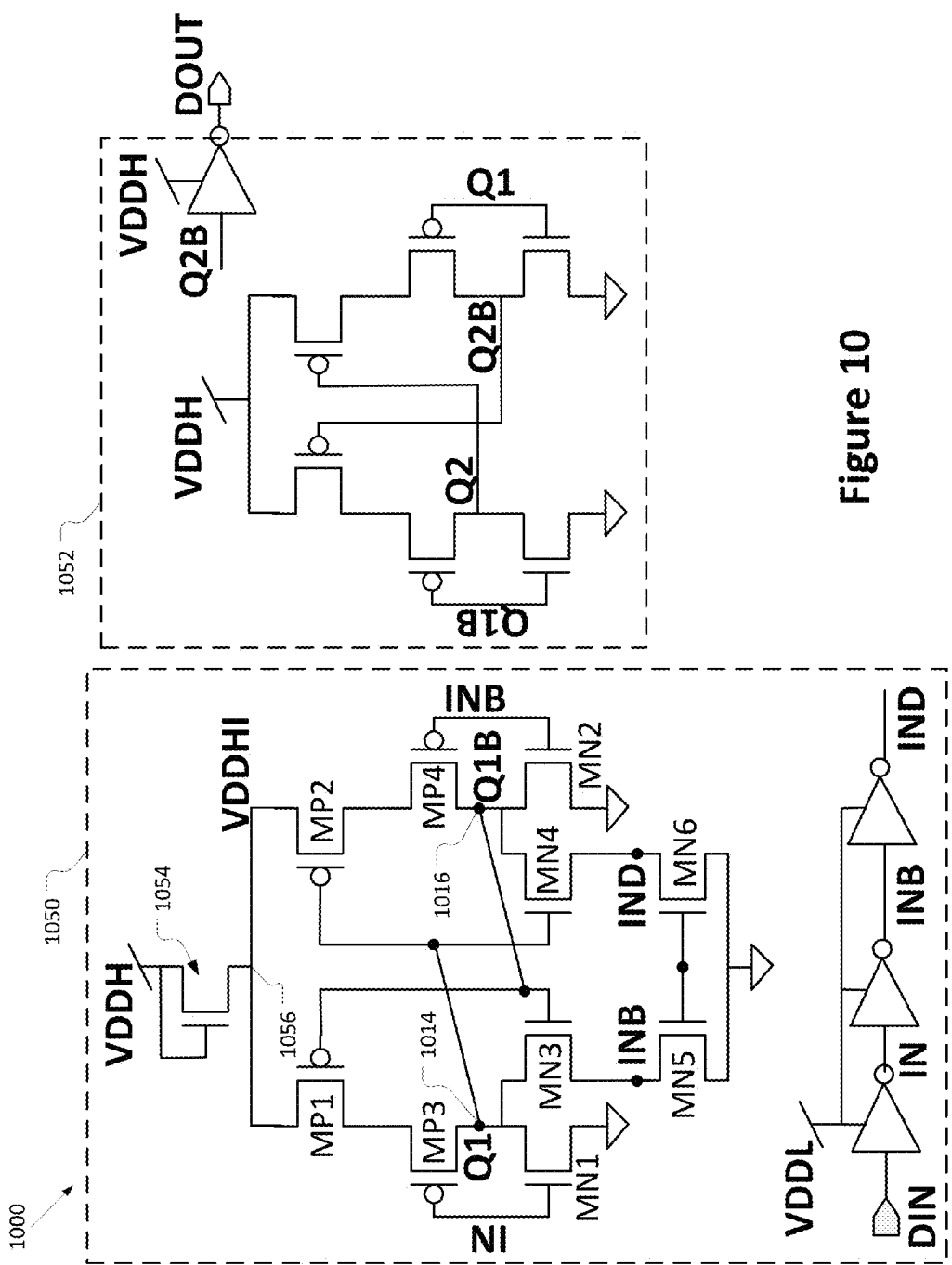
FIG. 10 illustrates a voltage level shifter circuit that includes two level shifter stages, in accordance with various embodiments.

FIG. 10 illustrates a voltage level shifter circuit 1000 (hereinafter "circuit 1000") in accordance with various embodiments. The circuit 1000 may include a first level shifter stage 1050 (also referred to as "first stage 1050") and a second level shifter stage 1052 (also referred to as "second stage 1052"). The first stage 1000 may include circuitry similar to the circuit 100, 200, 300, 400, 500, 600, 700, 800, and/or 900. For example, the first stage 1000 is shown in FIG. 10 to include circuitry similar to circuit 100 (having adaptive keeper circuitry). The first stage 1000 may include a diode-connected transistor 1054 coupled between a high supply rail 1020 and a node 1056 between the pull-up transistors MP1 and MP2. The diode-connected transistor 1054 may reduce the voltage at the node 1056 to an intermediate voltage VDDH1 that is below the high supply voltage VDDH (e.g., by the threshold voltage of the diode-connected transistor 1054). Accordingly, the first stage 1050 may generate a data signal Q1 at a data node 1014, and a data bar signal Q1B at a data bar node 1016, that are in an intermediate voltage domain between the low voltage domain and the high voltage domain. The data signal Q1 and data bar signal Q1B may be passed to the second stage 1052.

In various embodiments, the second stage 1052 may level shift the data signal Q1 and/or data bar signal Q1B to generate an output data signal that is in the high voltage domain (e.g., that fluctuates between 0 Volts and VDDH). The second stage 1052 may or may not include adaptive keeper circuitry, enhanced interruptible supply circuitry, and/or capacitive boosting circuitry.

It will be apparent that embodiments of circuit 1000 may include any suitable number of diode-connected transistors 1054 to generate the intermediate voltage VDDH1. Additionally, or alternatively, the circuit 1000 may include more than two level shifter stages in some embodiments.

Figure 11:
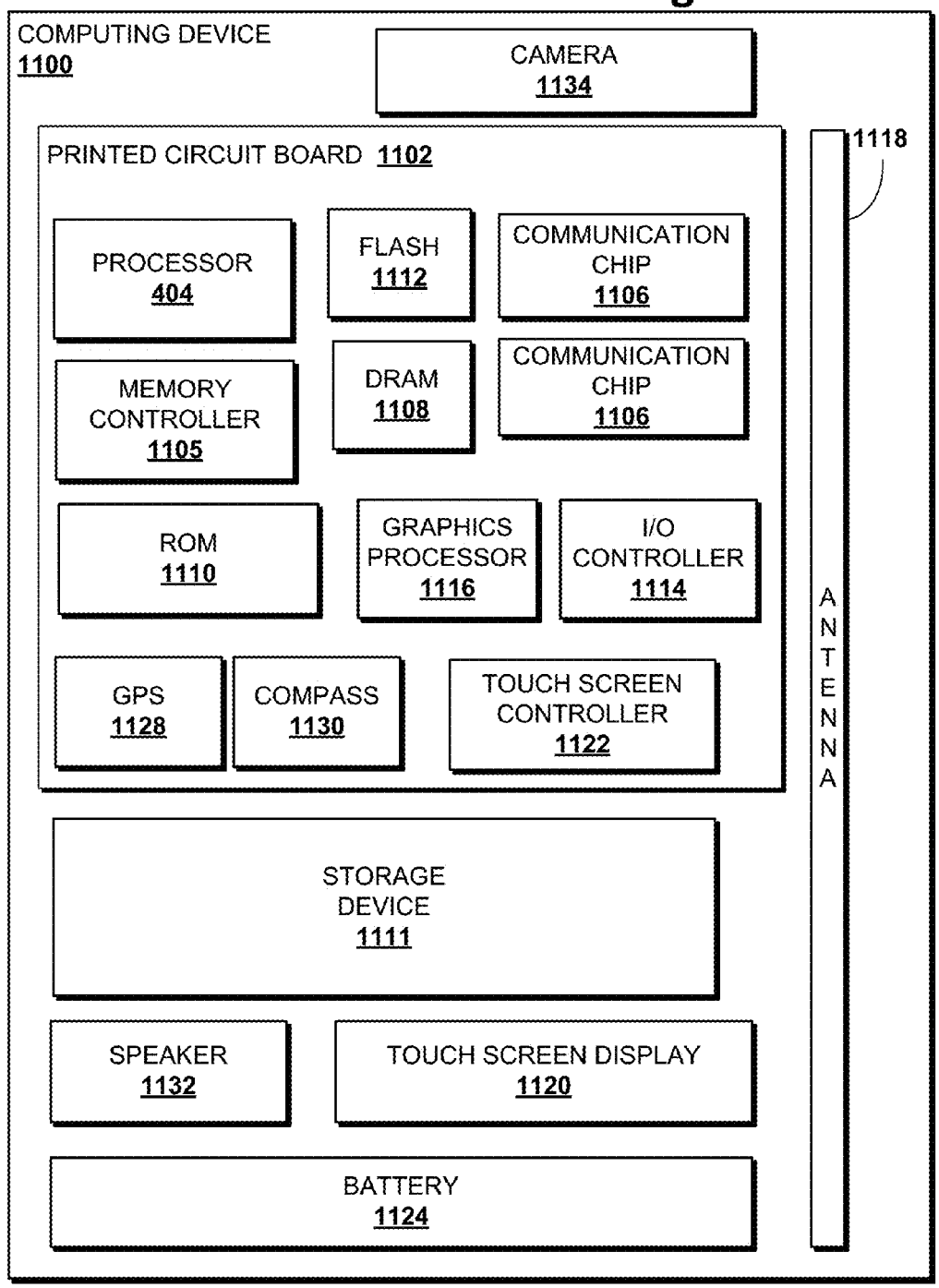
FIG. 11 illustrates an example system configured to employ the apparatuses and methods described herein, in accordance with various embodiments.

FIG. 11 illustrates an example computing device 1100 that may employ the apparatuses and/or methods described herein (e.g., circuit 100, 200, 300, 400, 500, 600, 700, 800, 900, or 1000), in accordance with various embodiments. As shown, computing device 1100 may include a number of components, such as one or more processor(s) 1104 (one shown) and at least one communication chip 1106. In various embodiments, the one or more processor(s) 1104 each may include one or more processor cores. In various embodiments, the at least one communication chip 1106 may be physically and electrically coupled to the one or more processor(s) 1104. In further implementations, the communication chip 1106 may be part of the one or more processor(s) 1104. In various embodiments, computing device 1100 may include printed circuit board (PCB) 1102. For these embodiments, the one or more processor(s) 1104 and communication chip 1106 may be disposed thereon. In alternate embodiments, the various components may be coupled without the employment of PCB 1102.

Depending on its applications, computing device 1100 may include other components that may or may not be physically and electrically coupled to the PCB 1102. These other components include, but are not limited to, memory controller 1105, volatile memory (e.g., dynamic random access memory (DRAM) 1108), non-volatile memory such as read only memory (ROM) 1110, flash memory 1112, storage device 1111 (e.g., a hard-disk drive (HDD)), an I/O controller 1114, a digital signal processor (not shown), a crypto processor (not shown), a graphics processor 1116, one or more antenna 1118, a display (not shown), a touch screen display 1120, a touch screen controller 1122, a battery 1124, an audio codec (not shown), a video codec (not shown), a global positioning system (GPS) device 1128, a compass 1130, an accelerometer (not shown), a gyroscope (not shown), a speaker 1132, a camera 1134, and a mass storage device (such as hard disk drive, a solid state drive, compact disk (CD), digital versatile disk (DVD)) (not shown), and so forth. In various embodiments, the processor 1104 may be integrated on the same die with other components to form a System on Chip (SoC).

In some embodiments, the one or more processor(s) 1104, flash memory 1112, and/or storage device 1111 may include associated firmware (not shown) storing programming instructions configured to enable computing device 1100, in response to execution of the programming instructions by one or more processor(s) 1104, to practice all or selected aspects of the methods described herein. In various embodiments, these aspects may additionally or alternatively be implemented using hardware separate from the one or more processor(s) 1111, flash memory 1112, or storage device 1111.

In various embodiments, one or more components of the computing device 1100 may include the circuit 100, 200, 300, 400, 500, 600, 700, 800, 900 and/or 1000 described herein. For example, the circuit 100, 200, 300, 400, 500, 600, 700, 800, 900 and/or 1000 may be included in I/O controller 1114, processor 1104, memory controller 1105, and/or another component of computing device 1100. In some embodiments, the circuit 100, 200, 300, 400, 500, 600, 700, 800, 900 and/or 1000 may be included in the processor 1104 to allow circuitry that operates in a relatively low voltage domain to interface with circuitry that operates in a relatively high voltage domain. In embodiments, the processor 1104 may include a plurality of circuits 100, 200, 300, 400, 500, 600, 700, 800, 900 and/or 1000.

The communication chips 1106 may enable wired and/or wireless communications for the transfer of data to and from the computing device 1100. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1106 may implement any of a number of wireless standards or protocols, including but not limited to IEEE 702.20, Long Term Evolution (LTE), LTE Advanced (LTE-A), General Packet Radio Service (GPRS), Evolution Data Optimized (Ev-DO), Evolved High Speed Packet Access (HSPA+), Evolved High Speed Downlink Packet Access (HSDPA+), Evolved High Speed Uplink Packet Access (HSUPA+), Global System for Mobile Communications (GSM), Enhanced Data rates for GSM Evolution (EDGE), Code Division Multiple Access (CDMA), Time Division Multiple Access (TDMA), Digital Enhanced Cordless Telecommunications (DECT), Worldwide Interoperability for Microwave Access (WiMAX), Bluetooth, derivatives thereof, as well as any other wireless protocols that are designated as 3G, 4G, 5G, and beyond. The computing device 1100 may include a plurality of communication chips 1106. For instance, a first communication chip 1106 may be dedicated to shorter range wireless communications such as Wi-Fi and Bluetooth, and a second communication chip 1106 may be dedicated to longer range wireless communications such as GPS, EDGE, GPRS, CDMA, WiMAX, LTE, Ev-DO, and others.

In various implementations, the computing device 1100 may be a laptop, a netbook, a notebook, an ultrabook, a smartphone, a computing tablet, a personal digital assistant (PDA), an ultra-mobile PC, a mobile phone, a desktop computer, a server, a printer, a scanner, a monitor, a set-top box, an entertainment control unit (e.g., a gaming console or automotive entertainment unit), a digital camera, an appliance, a portable music player, or a digital video recorder. In further implementations, the computing device 1100 may be any other electronic device that processes data.

Some non-limiting Examples are presented below.

Example 1 is a voltage level shifter circuit comprising: an input node to receive an input signal in a first voltage domain; a data node to hold a logic state of the input signal for generation of an output signal that corresponds to the input signal and is in a second voltage domain; a data bar node to hold a logic state of an input bar signal that is the inverse of the input signal; and a keeper transistor having a source terminal coupled to the data node, a gate terminal coupled to the data bar node, and a drain terminal to receive the input bar signal.

Example 2 is the circuit of Example 1, wherein the keeper transistor is a first keeper transistor, and wherein the circuit further comprises a second keeper transistor having a source terminal coupled to the data bar node, a gate terminal coupled to the data node, and a drain terminal to receive a delayed version of the input signal.

Example 3 is the circuit of Example 2, further comprising: a first firewall transistor coupled between the first keeper transistor and a ground terminal; and a second firewall transistor coupled between the second keeper transistor and the ground terminal, wherein a gate terminal of the second firewall transistor is coupled to a gate terminal of the first firewall transistor, and wherein the gate terminals of the first and second firewall transistors are to receive a firewall signal to selectively drive the data node and the data bar node to 0 Volts when the first voltage domain is power gated.

Example 4 is the circuit of any one of Examples 1 to 3, further comprising: a pull-down transistor coupled between the data node and a ground terminal; an interruption transistor coupled to the data node; and a pull-up transistor coupled between the interruption transistor and a supply rail, the supply rail to receive a supply voltage.

Example 5 is the circuit of Example 4, wherein gate terminals of the interruption transistor and the pull-down transistor are to receive the input signal, and wherein a gate terminal of the pull-up transistor is coupled to the data bar node.

Example 6 is the circuit of Example 5, wherein the pull-down transistor is a first pull-down transistor, and wherein the circuit further comprises a second pull-down transistor coupled between the ground terminal and an intermediate node that is between the pull-up transistor and the interruption transistor, wherein a gate terminal of the second pull-down transistor is to receive the input signal.

Example 7 is the circuit of Example 6, wherein the interruption transistor is a first interruption transistor, and wherein the circuit further comprises: a second interruption transistor coupled between the first interruption transistor and the pull-up transistor; and a third pull-down transistor coupled between the ground terminal and a second intermediate node that is between the pull-up transistor and the second interruption transistor, wherein a gate terminal of the third pull-down transistor is to receive the input signal.

Example 8 is the circuit of Example 4, further comprising capacitive boosting circuitry coupled to the input node to pass a boosted input signal to the interruption transistor and the pull-down transistor.

Example 9 is the circuit of Example 1, wherein the input node, data node, data bar node, and keeper transistor are included in a first stage of the voltage-level shifter circuit, and wherein the voltage-level shifter circuit further includes a second stage to receive the output signal of the first stage and generate an output signal of the second stage that is in a third voltage domain.

Example 10 is a voltage level shifter circuit comprising: an input node to receive an input data signal associated with a first voltage domain; a data node to hold a logic state of the input data signal for generation of an output signal that corresponds to the input signal and is in a second voltage domain that is higher than the first voltage domain; a first pull-down transistor coupled between the data node and a ground terminal, a gate terminal of the pull-down transistor to receive the input signal; an interruption transistor coupled to the data node, a gate terminal of the interruption transistor to receive the input signal; a pull-up transistor coupled between the interruption transistor and a supply rail, the supply rail to receive a supply voltage associated with the second voltage domain; and a second pull-down transistor coupled between the ground terminal and an intermediate node that is between the pull-up transistor and the interruption transistor, wherein a gate terminal of the second pull-down transistor is to receive the input signal.

Example 11 is the circuit of Example 10, wherein the interruption transistor is a first interruption transistor, and wherein the circuit further comprises: a second interruption transistor coupled between the first interruption transistor and the pull-up transistor; and a third pull-down transistor coupled between the ground terminal and a second intermediate node that is between the pull-up transistor and the second interruption transistor, wherein a gate terminal of the third pull-down transistor is to receive the input signal.

Example 12 is the circuit of Example 10, further comprising a data bar node to hold a logic state of an input bar signal that is the inverse of the input signal, wherein a gate terminal of the pull-up transistor is coupled to the data bar node.

Example 13 is the circuit of Example 12, further comprising a keeper transistor having a source terminal coupled to the data node, a gate terminal coupled to the data bar node, and a drain terminal to receive the input bar signal.

Example 14 is the circuit of Example 13, wherein the keeper transistor is a first keeper transistor, and wherein the circuit further comprises a second keeper transistor having a source terminal coupled to the data bar node, a gate terminal coupled to the data node, and a drain terminal to receive a delayed version of the input signal.

Example 15 is the circuit of any one of Examples 10 to 14, further comprising capacitive boosting circuitry coupled to the input node to increase a voltage of the input data signal of at the data node above a supply voltage of the first voltage domain.

Example 16 is the circuit of Example 15, wherein the input node is a first input node, and wherein the capacitive boosting circuitry includes: a p-type transistor coupled between a second input node and the first input node, wherein the second input node is to receive the data signal in the first voltage domain, and wherein a gate terminal of the first p-type transistor to receive a delayed version of the data signal; an n-type transistor coupled between the first input node and the second input node, a gate terminal of the n-type transistor to receive a supply voltage associated with the first voltage domain; and a capacitive-coupled transistor coupled between the p-type transistor and the first input node, the capacitive-coupled transistor to charge the first input node to generate a boosted data signal at the first input node.

Example 17 is the circuit of Example 11, further comprising an enable transistor coupled between the second pull-down transistor and the ground terminal, the gate terminal of the enable transistor to receive an enable signal to selectively enable an enhanced supply interruption mode of the circuit.

Example 18 is a system comprising: a first input node to receive an input signal in a low voltage domain; and capacitive boosting circuitry coupled between the first input node and a second input node, the capacitive boosting circuitry comprising: a p-type transistor coupled between the first input node and the second input node, a gate terminal of the first p-type transistor to receive a delayed version of the input signal; an n-type transistor coupled between the first input node and the second input node, a gate terminal of the n-type transistor to receive a low supply voltage associated with the low voltage domain; and a capacitive-coupled transistor coupled between the p-type transistor and the second input node, the capacitive-coupled transistor to charge the second input node to a voltage level greater than the low supply voltage to generate a boosted input signal. The system of Example 18 further comprises level-shifting circuitry to receive the boosted input signal at the second input node and to generate an output signal that corresponds to the input signal and is in a high voltage domain having a higher voltage level than the low voltage domain.

Example 19 is the system of Example 18, wherein the p-type transistor and the n-type transistor are coupled in parallel with one another.

Example 20 is the system of Example 18, wherein a gate terminal of the capacitive-coupled transistor is to receive the delayed version of the input signal.

Example 21 is the system of Example 18, wherein the level-shifting circuitry includes: an interruption transistor coupled to a data node that is to hold a logic state of the input signal, wherein a gate terminal of the interruption transistor is coupled to the second input node; a pull-up transistor coupled between the interruption transistor and a supply rail, the supply rail to receive a high supply voltage associated with the high voltage domain; and a pull-down transistor coupled between the ground terminal and an intermediate node that is between the pull-up transistor and the interruption transistor, wherein a gate terminal of the pull-down transistor is coupled to the second input node.

Example 22 is the system of Example 21, wherein the level-shifting circuitry further comprises: a data node to hold a logic state of the input signal; a data bar node to hold a logic state of an input bar signal that is the inverse of the input signal; a keeper transistor having a source terminal coupled to the data node, a gate terminal coupled to the data bar node, and a drain terminal to receive the input bar signal.

Example 23 is the system of Example 18, further comprising an enable transistor coupled to the second input node, the enable transistor to selectively pass the input signal to the second input node when the capacitive boosting circuitry is disabled.

Example 24 is the system of any one of Examples 18 to 23, further comprising: a processor coupled to the level-shifting circuitry, the processor including a first circuit block to operate in the low voltage domain and a second circuit block to operate in the high voltage domain.

Although certain embodiments have been illustrated and described herein for purposes of description, this application is intended to cover any adaptations or variations of the embodiments discussed herein. Therefore, it is manifestly intended that embodiments described herein be limited only by the claims.

Where the disclosure recites "a" or "a first" element or the equivalent thereof, such disclosure includes one or more such elements, neither requiring nor excluding two or more such elements. Further, ordinal indicators (e.g., first, second, or third) for identified elements are used to distinguish between the elements, and do not indicate or imply a required or limited number of such elements, nor do they indicate a particular position or order of such elements unless otherwise specifically stated.

What is claimed is:

1. A voltage level shifter circuit comprising:
   an input node to receive an input signal in a first voltage domain;
   a data node to hold a logic state of the input signal for generation of an output signal that corresponds to the input signal and is in a second voltage domain;
   a data bar node to hold a logic state of an input bar signal that is the inverse of the input signal; and
   a keeper transistor having a source terminal coupled to the data node, a gate terminal coupled to the data bar node, and a drain terminal to receive the input bar signal.

2. The circuit of claim 1, wherein the keeper transistor is a first keeper transistor, and wherein the circuit further comprises a second keeper transistor having a source terminal coupled to the data bar node, a gate terminal coupled to the data node, and a drain terminal to receive a delayed version of the input signal.

3. The circuit of claim 2, further comprising:
   a first firewall transistor coupled between the first keeper transistor and a ground terminal; and
   a second firewall transistor coupled between the second keeper transistor and the ground terminal, wherein a gate terminal of the second firewall transistor is coupled to a gate terminal of the first firewall transistor, and wherein the gate terminals of the first and second firewall transistors are to receive a firewall signal to selectively drive the data node and the data bar node to 0 Volts when the first voltage domain is power gated.

4. The circuit of claim 1, further comprising:
   a pull-down transistor coupled between the data node and a ground terminal;
   an interruption transistor coupled to the data node; and
   a pull-up transistor coupled between the interruption transistor and a supply rail, the supply rail to receive a supply voltage.

5. The circuit of claim 4, wherein gate terminals of the interruption transistor and the pull-down transistor are to receive the input signal, and wherein a gate terminal of the pull-up transistor is coupled to the data bar node.

6. The circuit of claim 5, wherein the pull-down transistor is a first pull-down transistor, and wherein the circuit further comprises a second pull-down transistor coupled between the ground terminal and an intermediate node that is between the pull-up transistor and the interruption transistor, wherein a gate terminal of the second pull-down transistor is to receive the input signal.

7. The circuit of claim 6, wherein the interruption transistor is a first interruption transistor, and wherein the circuit further comprises:
   a second interruption transistor coupled between the first interruption transistor and the pull-up transistor; and
   a third pull-down transistor coupled between the ground terminal and a second intermediate node that is between the pull-up transistor and the second interruption transistor, wherein a gate terminal of the third pull-down transistor is to receive the input signal.

8. The circuit of claim 4, further comprising capacitive boosting circuitry coupled to the input node to pass a boosted input signal to the interruption transistor and the pull-down transistor.

9. The circuit of claim 1, wherein the input node, data node, data bar node, and keeper transistor are included in a first stage of the voltage-level shifter circuit, and wherein the voltage-level shifter circuit further includes a second stage to receive the output signal of the first stage and generate an output signal of the second stage that is in a third voltage domain.

10. A voltage level shifter circuit comprising:
    an input node to receive an input data signal associated with a first voltage domain;
    a data node to hold a logic state of the input data signal for generation of an output signal that corresponds to the input signal and is in a second voltage domain that is higher than the first voltage domain;
    a first pull-down transistor coupled between the data node and a ground terminal, a gate terminal of the pull-down transistor to receive the input signal;
    an interruption transistor coupled to the data node, a gate terminal of the interruption transistor to receive the input signal;
    a pull-up transistor coupled between the interruption transistor and a supply rail, the supply rail to receive a supply voltage associated with the second voltage domain; and
    a second pull-down transistor coupled between the ground terminal and an intermediate node that is between the pull-up transistor and the interruption transistor, wherein a gate terminal of the second pull-down transistor is to receive the input signal.

11. The circuit of claim 10, wherein the interruption transistor is a first interruption transistor, and wherein the circuit further comprises:
    a second interruption transistor coupled between the first interruption transistor and the pull-up transistor; and
    a third pull-down transistor coupled between the ground terminal and a second intermediate node that is between the pull-up transistor and the second interruption transistor, wherein a gate terminal of the third pull-down transistor is to receive the input signal.

12. The circuit of claim 11, further comprising an enable transistor coupled between the second pull-down transistor and the ground terminal, the gate terminal of the enable transistor to receive an enable signal to selectively enable an enhanced supply interruption mode of the circuit.

13. The circuit of claim 10, further comprising a data bar node to hold a logic state of an input bar signal that is the inverse of the input signal, wherein a gate terminal of the pull-up transistor is coupled to the data bar node.

14. The circuit of claim 13, further comprising a keeper transistor having a source terminal coupled to the data node, a gate terminal coupled to the data bar node, and a drain terminal to receive the input bar signal.

15. The circuit of claim 14, wherein the keeper transistor is a first keeper transistor, and wherein the circuit further comprises a second keeper transistor having a source terminal coupled to the data bar node, a gate terminal coupled to the data node, and a drain terminal to receive a delayed version of the input signal.

16. The circuit of claim 10, further comprising capacitive boosting circuitry coupled to the input node to increase a voltage of the input data signal at the data node above a supply voltage of the first voltage domain.

17. The circuit of claim 16, wherein the input node is a first input node, and wherein the capacitive boosting circuitry includes:
- a p-type transistor coupled between a second input node and the first input node, wherein the second input node is to receive the data signal in the first voltage domain, and wherein a gate terminal of the p-type transistor is to receive a delayed version of the data signal;
- an n-type transistor coupled between the first input node and the second input node, a gate terminal of the n-type transistor to receive a supply voltage associated with the first voltage domain; and
- a capacitive-coupled transistor coupled between the p-type transistor and the first input node, the capacitive-coupled transistor to charge the first input node to generate a boosted data signal at the first input node.

18. A circuit comprising:
- a first input node to receive an input signal in a low voltage domain;
- capacitive boosting circuitry coupled between the first input node and a second input node, the capacitive boosting circuitry comprising:
  - a p-type transistor coupled between the first input node and the second input node, a gate terminal of the p-type transistor to receive a delayed version of the input signal;
  - an n-type transistor coupled between the first input node and the second input node, a gate terminal of the n-type transistor to receive a low supply voltage associated with the low voltage domain; and
  - a capacitive-coupled transistor coupled between the p-type transistor and the second input node, the capacitive-coupled transistor to charge the second input node to a voltage level greater than the low supply voltage to generate a boosted input signal; and
- level-shifting circuitry to receive the boosted input signal at the second input node and to generate an output signal that corresponds to the input signal and is in a high voltage domain having a higher voltage level than the low voltage domain.

19. The circuit of claim 18, wherein the p-type transistor and the n-type transistor are coupled in parallel with one another.

20. The circuit of claim 18, wherein a gate terminal of the capacitive-coupled transistor is to receive the delayed version of the input signal.

21. The circuit of claim 18, wherein the level-shifting circuitry includes:
- an interruption transistor coupled to a data node that is to hold a logic state of the input signal, wherein a gate terminal of the interruption transistor is coupled to the second input node;
- a pull-up transistor coupled between the interruption transistor and a supply rail, the supply rail to receive a high supply voltage associated with the high voltage domain; and
- a pull-down transistor coupled between a ground terminal and an intermediate node that is between the pull-up transistor and the interruption transistor, wherein a gate terminal of the pull-down transistor is coupled to the second input node.

22. The circuit of claim 21, wherein the level-shifting circuitry further comprises:
- a data node to hold a logic state of the input signal;
- a data bar node to hold a logic state of an input bar signal that is the inverse of the input signal;
- a keeper transistor having a source terminal coupled to the data node, a gate terminal coupled to the data bar node, and a drain terminal to receive the input bar signal.

23. The circuit of claim 18, further comprising an enable transistor coupled to the second input node, the enable transistor to selectively pass the input signal to the second input node when the capacitive boosting circuitry is disabled.

24. The system of claim 18, further comprising:
- a processor coupled to the level-shifting circuitry, the processor including a first circuit block to operate in the low voltage domain and a second circuit block to operate in the high voltage domain.

* * * * *